US008533121B1

(12) United States Patent
Piesinger (10) Patent No.: US 8,533,121 B1
(45) Date of Patent: Sep. 10, 2013

(54) METHOD AND APPARATUS FOR PHASE IDENTIFICATION IN A THREE-PHASE POWER DISTRIBUTION NETWORK

(76) Inventor: Gregory Hubert Piesinger, Cave Creek, AZ (US)

(*) Notice: Subject to any disclaimer, the term of this patent is extended or adjusted under 35 U.S.C. 154(b) by 409 days.

(21) Appl. No.: 12/927,767

(22) Filed: Nov. 23, 2010

Related U.S. Application Data (60) Provisional application No. 61/281,996, filed on Nov. 25, 2009.

(51) Int. Cl.
*H02J 13/00* (2006.01)
*G01R 25/00* (2006.01)
*G06F 11/30* (2006.01)
*G06F 17/40* (2006.01)
*G06F 19/00* (2011.01)

(52) U.S. Cl.
USPC ........... 705/57; 73/865.8; 73/856.9; 307/149; 324/66; 324/86; 340/539.17; 340/658; 702/72; 702/73; 702/187; 702/188; 702/189

(58) Field of Classification Search
USPC ............ 73/432.1, 865.8, 865.9, 866.3, 866.5; 307/106, 149; 323/371; 324/66, 72, 72.5, 324/73.1, 76.11, 76.77, 86, 107, 113, 600, 324/612, 620, 622; 340/500, 531, 539.1, 340/539.16, 539.17, 540, 635, 657, 658; 340/870.01, 870.07, 870.016, 870.28; 361/1, 361/78, 85; 700/90, 286, 292, 294; 702/1, 702/57, 60, 61, 62, 64, 65, 66, 71, 72, 73, 702/127, 187, 188, 189
IPC ................ G01D 7/00; G01R 1/00, 1/28, 17/00, G01R 17/02, 25/00, 29/00, 29/18; G06F 11/00, G06F 11/30, 11/32, 17/00, 17/40, 19/00; H02J 13/00
See application file for complete search history.

(56) References Cited

U.S. PATENT DOCUMENTS

| | | | | |
|---|---|---|---|---|
| 2,789,268 A * | 4/1957 | Bechtel et al. | ................... | 324/66 |
| 3,027,513 A * | 3/1962 | Mulavey et al. | ........... | 324/76.83 |
| 3,076,931 A * | 2/1963 | Jasper | ............................. | 324/66 |
| 3,382,483 A * | 5/1968 | Brothman et al. | ........ | 340/870.07 |
| 3,469,082 A * | 9/1969 | Thompson | ...................... | 702/72 |
| 5,521,491 A * | 5/1996 | Najam | ............................ | 324/86 |
| 6,642,700 B2 * | 11/2003 | Slade et al. | ..................... | 324/66 |
| 6,667,610 B2 * | 12/2003 | Piesinger | ........................ | 324/66 |
| 7,031,859 B2 * | 4/2006 | Piesinger | ........................ | 702/72 |
| 7,598,720 B2 * | 10/2009 | Veroni et al. | ..................... | 324/66 |
| 8,013,592 B2 * | 9/2011 | Giubbini et al. | ........... | 324/76.77 |
| 8,217,640 B2 * | 7/2012 | Tazzari et al. | .................. | 324/66 |
| 2003/0169029 A1 * | 9/2003 | Piesinger | ........................ | 324/66 |
| 2003/0184275 A1 * | 10/2003 | Slade et al. | ....................... | 324/66 |
| 2004/0160227 A1 * | 8/2004 | Piesinger | ...................... | 324/539 |

(Continued)

*Primary Examiner* — Edward Cosimano (57) ABSTRACT

A remote phase identification system identifies the unknown phase attribute of any energized conductor within a three-phase power distribution network. A field probe at a remote location obtains an instantaneous phase measurement at a precise GPS second and communicates this phase, GPS second, and GPS coordinates to a field client. Either wireless Internet or satellite modem communications is used by the field client to retrieve the reference phase taken by a base station at the same GPS second. Field client tagging reference phase configuration files are automatically created for any circuit and applied to the base station reference phase. Configuration files can be named, saved, and loaded and are used by the field client to identify and display the unknown phase attribute. A field client can be any personal computer, smartphone, or personal digital assistant.

20 Claims, 10 Drawing Sheets

500

1. Base server at reference location measures and stores instantaneous phase at each GPS second.

2. Field probe at field location measures an instantaneous phase at a GPS second.

3. Field probe communicates measured instantaneous phase and GPS second to field client at field location.

4. Field client transmits reference phase request for the GPS second to base server.

5. Base server transmits requested instantaneous phase back to field client.

6. Field client determines field location phase attribute by comparing field location and reference location instantaneous phases.

(56) References Cited

U.S. PATENT DOCUMENTS

| | | | |
|---|---|---|---|
| 2004/0263147 A1* | 12/2004 | Piesinger | 324/86 |
| 2007/0247139 A1* | 10/2007 | Veroni et al. | 324/84 |
| 2008/0116877 A1* | 5/2008 | Giubbini et al. | 324/84 |
| 2010/0237852 A1* | 9/2010 | Tazzari et al. | 324/86 |
| 2011/0285379 A1* | 11/2011 | Giubbini et al. | 324/66 |

* cited by examiner

| Attribute obtained | Set base to |
|---|---|
| A | A |
| AB | -CA |
| -B | -C |
| -BC | BC |
| C | B |
| CA | -AB |
| -A | -A |
| -AB | CA |
| B | C |
| BC | -BC |
| -C | -B |
| -CA | AB |

FILE  ADD MEASUREMENT  GPS  HELP

400

| | | | | | VIEW |
|---|---|---|---|---|---|
| REPORT NAME | Jakes corner | | | | ● LOCATION GPS |
| SUBSTATION | Roundtree | | | | ○ MEASURMENT GPS |
| LOCATION | 231 Highway 101, Red Cloud, NM | | | | |
| GPS | Auto fill in coordinates based on GPS view selection | | | | GET NEW GPS |
| DATE | Auto fill in based on measurement view selection | | | | GOOGLE GPS |
| TIME | Auto fill in based on measurement view selection | | | | |
| DISCRIPTION | East - West distribution corner | | | | |

405

410 ← Manual fill in

408

| VIEW | MESUREMENT | VOLTAGE | SOURCE | POSITION | CIRCUIT IDENTIFICATION | ATTRIBUTE |
|---|---|---|---|---|---|---|
| ○ | 1553-000456 | 7200 | FEEDER | TOP | 24879 | A |
| ○ | 1553-012345 | 7200 | FEEDER | MIDDLE | 37829884 | B |
| ● | 1553-123456 | 120 ▶ | FEEDER ▶ | TOP ▶ | | C |
| | | (BLANK) | (BLANK) | (BLANK) | ← Manual fill in | Auto fill in |
| | | 120 V | BREAKER | H1 | | A |
| | | 240 V | CABINET | H2 | | -A |
| | | 480 V | CAPACITOR | H3 | | B |
| | | 4 KV | FEEDER | X1 | | -B |
| | | 7.2 KV | OVERHEAD | X2 | | C |
| | | 12.5 KV | REACTOR | X3 | | -C |
| | | 14.4 KV | RECLOSER | TOP | | AB |
| | | 34.5 KV | REGULATOR | CENTER | | -AB |
| | | 69 KV | RELAY | BOTTOM | | BC |
| | | 115 KV | SWITCH | EAST | | -BC |
| | | 138 KV | TRANSFORMER | WEST | | CA |
| | | 230 KV | UNDERGROUND | FIELD | | -CA |
| | | 345 KV | OTHER | ROAD | | |
| | | OTHER | | OTHER | | |

415

420 — COMMENTS

1. Base server at reference location measures and stores instantaneous phase at each GPS second.

2. Field probe at field location measures an instantaneous phase at a GPS second.

3. Field probe communicates measured instantaneous phase and GPS second to field client at field location.

4. Field client transmits reference phase request for the GPS second to base server.

5. Base server transmits requested instantaneous phase back to field client.

6. Field client determines field location phase attribute by comparing field location and reference location instantaneous phases.

1. Select a field location with a known phase attribute.
2. Measure a reference location instantaneous phase at a GPS second.
3. Measure selected field location instantaneous phase at the same GPS second.
4. Add a configuration file offset phase to the reference location instantaneous phase to obtain a new offset reference location instantaneous phase.
5. Compare the field location and offset reference location instantaneous phases.
6. Select the offset phase so that the reported phase attribute of the selected field location equals its known phase attribute.

FIG. 10

METHOD AND APPARATUS FOR PHASE IDENTIFICATION IN A THREE-PHASE POWER DISTRIBUTION NETWORK

RELATED INVENTION

The present invention claims priority under 35 U.S.C. §119 (e) to: "Phase Identification Apparatus and Method" Provisional U.S. Patent Application Ser. No. 61/281,996, filed 25 Nov. 2009 now expired which is incorporated by reference herein.

TECHNICAL FIELD OF THE INVENTION

The present invention relates to the field of three-phase power distribution networks. More specifically, the present invention relates to the field of identifying the phase of a cable in a three-phase power distribution network.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage 345,000 volts phase-to-phase (345 KV) is delivered to multiple high voltage substations at which transformers step this high voltage down to a lower three-phase voltage 115 KV. Multiple transmission substations further lower the voltage to 69 KV. This 69 KV three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120 and 240 volts for delivery to the commercial and residential customers.

The instantaneous phases of the three conductors in a three-phase system are separated by 120 degrees. A phase attribute of A, B, or C is typically assigned to each of the three conductors to identify them. The initial assignment of phase attribute to each of the three conductors typically takes place at a transmission or distribution substation and this assignment is somewhat arbitrary. The attributes assigned at the substations become known as the tagging reference phases for that substation because the goal is to consistently tag, mark, or identify each conductor with its proper phase attribute throughout the substation's distribution region.

Utilities have many reasons for accurately identifying the phase of each conductor in their utility. Examples are load balancing to reduce neutral current flow, faster service restoration after outages, and for distribution automation purposes.

Most currently available phase identification instruments use GPS timing signals to obtain instantaneous phase measurements at a reference location and field location at the same instant of time. The phase attribute at the reference location is known which allows the phase attribute at the field location to be determined. For example, if the reference location phase attribute is B and the instantaneous phase measured at both locations are the same, then the field location phase attribute is also B. If the instantaneous field location phase is leading or lagging the instantaneous reference location phase by 120 degrees, then the field location phase attribute is either A or C depending on the utilities known phase rotation.

To identify the field location phase attribute, the instantaneous phases at both locations have to be compared. Current phase identification instruments differ primarily in the method they each use to communicate the instantaneous phase reading between the reference location unit and the field location unit. Most manufacturers implement a real-time communication system using cell phones. 0's, U.S. Pat. Nos. 6,667,610 and 7,031,859 describe a phase identification method that does not require real-time cell phone communication.

Current real-time phase identification systems have a number of shortcomings that make those system difficult to use. In particular, there are 3 primary problems with all current real-time phase identification systems that the present invention overcomes.

The first problem is that current systems require that the user install a dedicated phone line at the reference location. This is both a cost factor and an operational problem in that only one field user can access the reference location at the same time. Other users will receive a busy signal until the current user finishes his field measurements and disconnects from the system.

A second problem is that field cell phone coverage is marginal in most rural areas of the country. Without cell phone service, most current real-time phase identification systems cannot be used in those areas.

A third problem is that no current real-time phase identification system implements an easy method to account for tagging reference phase. Tagging reference phase is the most confusing aspect of phase identification for most linemen. Every time high voltage is stepped down to a lower voltage using a delta-wye or wye-delta transformer, a 30 degree phase rotation occurs. Without an easy way to account for these phase rotations, field phase attribute readings are meaningless.

Accordingly, it is the object of the present invention to provide a new and improved real-time method of identifying the phase of a conductor that solves these problems, overcomes other shortcomings, adds new features, and is easier for line crews to use.

SUMMARY OF THE INVENTION

Briefly, to achieve the desired objects of the present invention, the dedicated phone line problem is solved by implementing an Internet based server at the reference location that can service a very, large number of field location users simultaneously over the Internet without the need for a dedicated phone line.

The cell phone coverage problem is solved by implementing an Internet/satellite based data messaging service that allows field users anywhere to communicate with the reference location.

The tagging reference phase problem is solved by implementing a method to automatically define a new tagging reference phase whenever one is required. This tagging reference phase is stored in a configuration file on the field location personal computer (PC) and can be instantly loaded whenever it is needed.

It is a further object of the present invention to implement a datalogger function to store the phase attribute and GPS location of each field location measurement along with user reports and notes about the measurement.

It is a further object of the present invention to implement a handheld field location unit that can be used by lower-labor-cost non-linemen personnel.

It is a further object of the present invention to implement the Internet access portion of the field location units on currently available PCs or Smartphones.

These and other embodiments are discussed below.

DETAILED DESCRIPTION OF THE PREFERRED EMBODIMENTS

Commonly owned U.S. Pat. No. 6,667,610 issued Dec. 23, 2003 and U.S. Pat. No. 7,031,859 issued Apr. 18, 2006, which are incorporated herein by reference, describe a non-real-time phase identification system.

Figure 1:
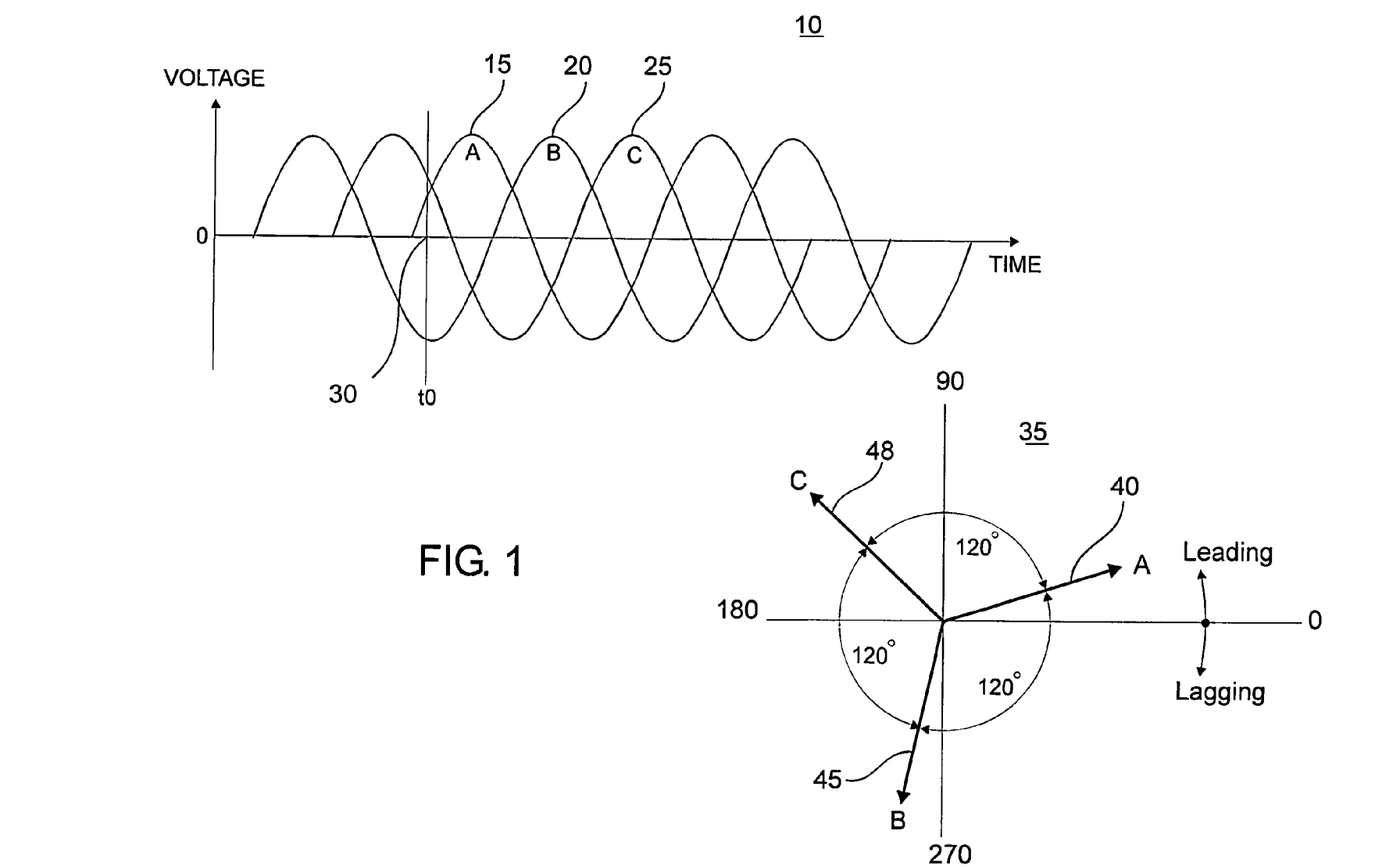
FIG. 1 illustrates voltage phase relationships in a three-phase power network using both voltage-time and phase vector diagrams.

The basic concept of three-phase power is illustrated in FIG. 1. Voltage-time waveform diagram 10 and rotational vector diagram 35 illustrate three-phase voltage-time waveforms 15, 20, and 25 at instantaneous time t0 30. Attribute B voltage 20 and vector 45 lags attribute A voltage 15 and vector 40 by 120 degrees. Likewise, attribute C voltage 25 and vector 48 lags attribute B voltage 20 and vector 45 by 120 degrees.

Figure 2:
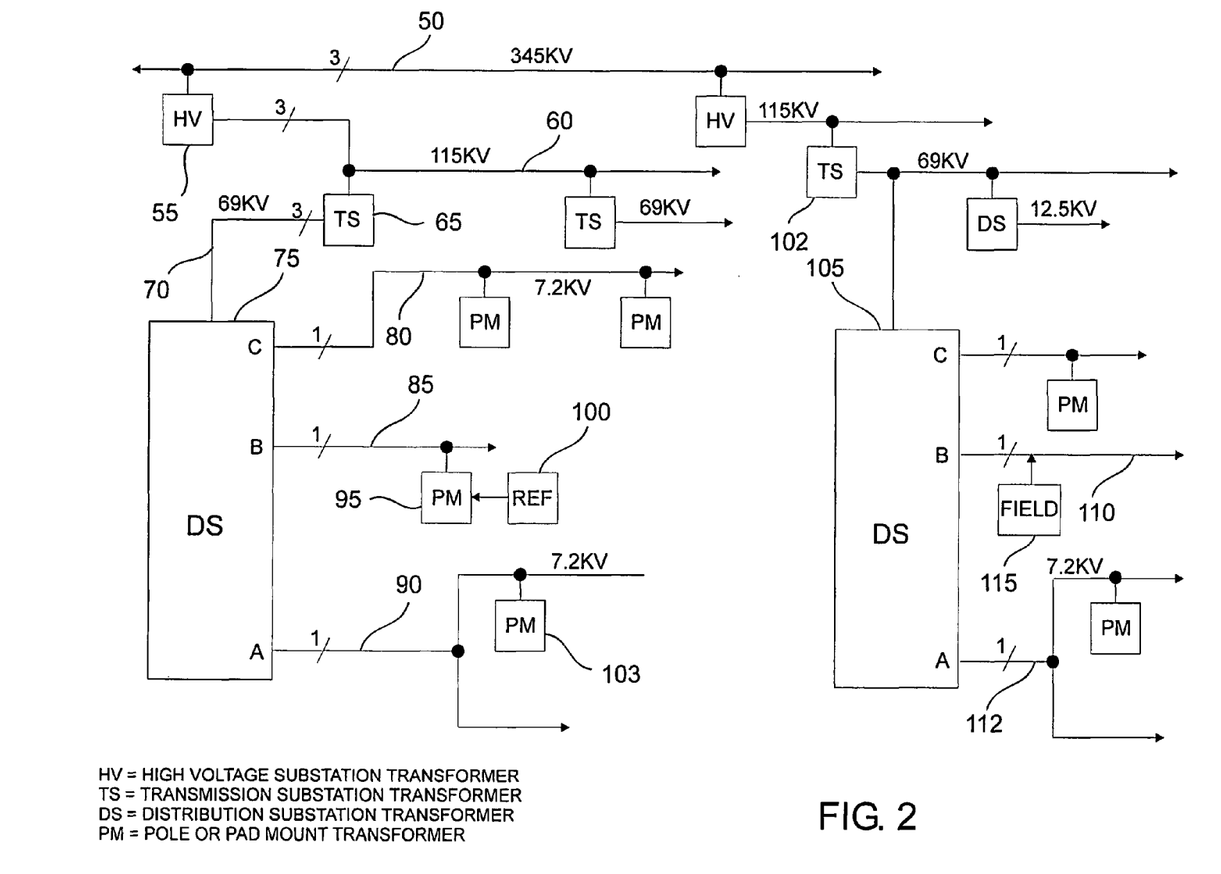
FIG. 2 illustrates a typical three-phase power distribution network.

A typical power distribution network is illustrated in FIG. 2 in which three-phase power cables 50 at 345 KV feed a series of high voltage (HV) transformers 55 spread out over a large geographical area. The 115 KV output 60 of transformers 55 are connected to a series of transmission transformers (TS) 65 also spread out over a large geographical area. The 69 KV output 70 of TS transformers 65 are connected to a series of distribution substation (DS) transformers 75 situated over a smaller geographical area.

The 7.2 KV phase-to-ground (12.5 KV phase-to-phase) phase A feeder 90 of DS transformer 75 powers a local distribution network, which contains a number of pole-mounted or pad-mounted (PM) transformers 103 that are used to provide the final 120/240 volt power to the commercial or residential customers. In the same manner, phase B feeder 85 and phase C feeder 80 also supply power to the same local distribution network.

At some reference location 100 in the power distribution network, a PM transformer 95 is used to provide a low-voltage reference phase that can be used to determine the unknown phase of a conductor at any field location 115 in the network.

As described in referenced U.S. Pat. Nos. 6,667,610 and 7,031,859, the instantaneous phase of voltage waveforms at two widely separated points in the power distribution network are measured and compared at the same instant of time using a GPS timing signal. Field location 115 phase measurement and GPS time are encoded into an alphanumeric sequence. At the base location, this sequence is decoded and field location 115 phase measurement is compared to reference location 100 phase measurement taken at the same instant of time.

For field location 115 illustrated in FIG. 2, both instantaneous phase measurements would be the same because both reference location 100 and field location 115 are on phase B. Therefore, conductor 110 would be identified as phase attribute B.

Figure 3:
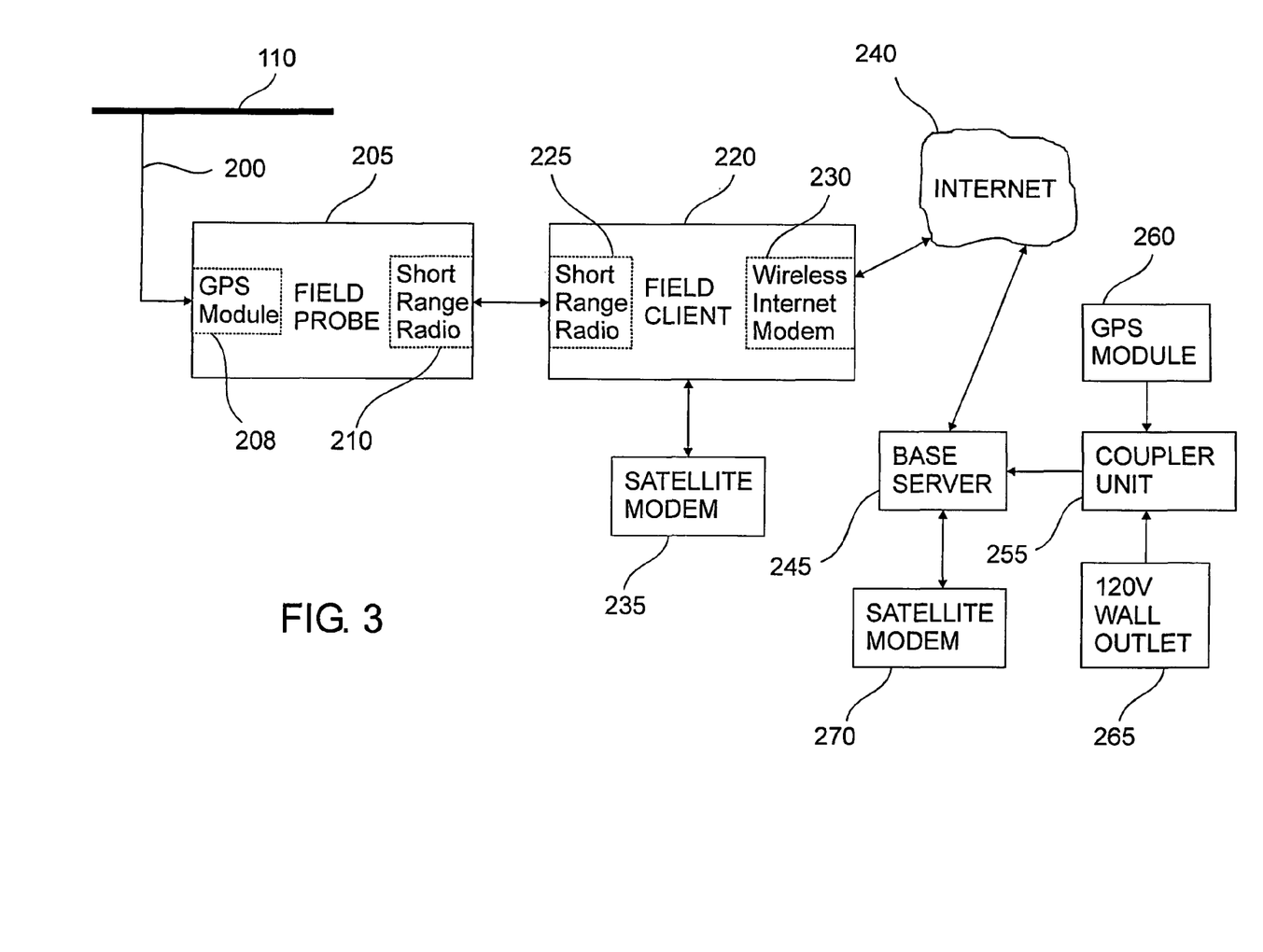
FIG. 3 illustrates a block diagram of the present invention whose main components are the field probe, field client, and base server.

A block diagram of the present invention is illustrated in FIG. 3. The instantaneous phase of conductor 110 at field location 115 is measured using field probe 205 using connection 200. Connection 200 may be either capacitive, proximity, or direct contact. At the next GPS second from GPS module 208, Field probe 205 takes an instantaneous phase measurement and encodes the phase along with the GPS second into an alphanumeric sequence and transmits this information to field client 220 using short range radio 210. Field client 220 receives this information using short range radio 225 and transmits a reference phase request to base server 245 at reference location 100 using wireless Internet modem 230 through Internet 240.

Figure 9:
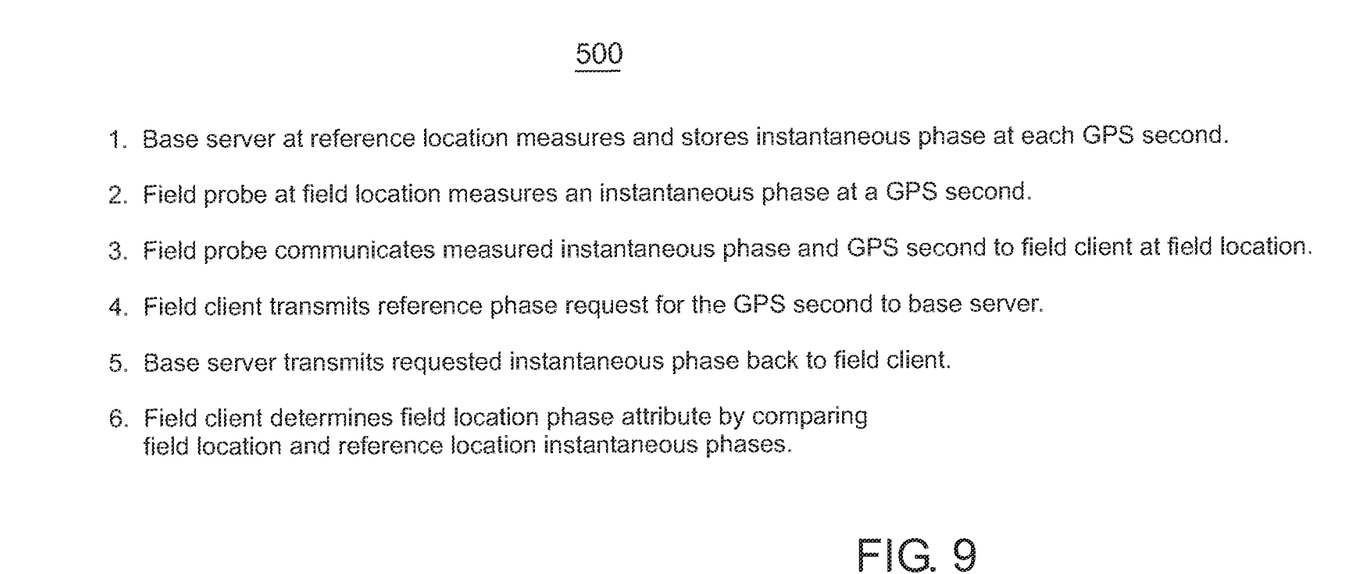
FIG. 9 illustrates the process steps for identifying phase attribute in the present invention.

At each GPS second from GPS module 260, coupler unit 255 measures the instantaneous phase from PM transformer 95 on phase B feeder 85 using 120 volt wall outlet 265 and stores the phase and GPS second on base server 245. When base server 245 obtains a reference phase request from field client 220, it retrieves the stored coupler 255 phase at the requested GPS second and sends it to field client 220 through Internet 240. Field client 220 compares field probe 205 phase with this reference phase, calculates conductor 110 phase attribute, displays the attribute on field client 220, and transmits the attribute back to field probe 205 which displays it to the user. These process steps 500 are listed in FIG. 9.

The basic implementation and operation of field probe 205, coupler 255, and base server 245 (except for the short range radio and server functions) are as described in referenced U.S. Pat. Nos. 6,667,610 and 7,031,859. The basic implementation, operation, and information display of field client 220 (except for the short range radio and client functions) are similar to base server 245 (without the server function). The short range radios, Internet, and client-server implementations essentially real-time automate the manual decoding of sequences described in the referenced patents.

Satellite modem 235 is optional and can be used to access base server 245 in remote areas where terrestrial wireless Internet coverage is not available. Satellite modem 270 is also optional and can be used to receive reference phase requests or text messages from field client 220 during power or Internet outages. Implementing text messaging allows line crews to use resources of the present invention to communicate with dispatch or other line crews when normal communications are not available such as during storms.

Base server 245 can be implemented using a standard PC, Internet modem, and local area network (LAN). Coupler unit 255 to base server 245 interface can be via standard RS232 serial port, universal serial bus (USB), LAN, optical, or BLUETOOTH brand wireless technology communication links. Reference location 100 phase measurements can be obtained every GPS second and stored on base server 245 PC hard drive or on some enterprise assessable server drive so multiple users can access the reference phase over a LAN. Base server 245 will support both automated and manual sequence decoding.

Field client 220 can also be implemented using a standard portable PC such as a laptop, notebook, or netbook. It can also be implemented using a variety of very portable personal communications devices such as Smartphones and personal digital assistants (PDAs). A popular device in use today is Research in Motion's BLACKBERRY brand Smartphone.

Many implementation options currently exist for short range radios 210 and 225. The most common option is the BLUETOOTH brand wireless technology standard which is built into most PCs and Smartphones. USB or RS232 modules are also widely available using this standard. These modules can be used with a USB or RS232 extension cable to mount the module on a sun visor or window to extend the radio range when field client 220 is mounted inside an utility truck. Using this standard, field probe 205 and field client 220 short range radio modules 210 and 225 respectively can be paired so as to ignore other modules using this standard and to speed up initial discovery.

Wireless Internet modem 230 can be implemented using an Air Card or Data Card available from many different cellular carrier companies. These modems are very economical as are their message costs since the digital message size of a reference phase request in the present invention is very small. These Air Cards can be obtained as a USB module which allows them to also be mounted on a sun visor or window to extend the radio range as described for the BLUETOOTH brand wireless technology standard USB module.

The present invention will select both a wireless Internet modem 230 that allows the use of an external antenna and an appropriate optional external high gain directional antenna. This will allow wireless Internet reception range to be extended in areas with marginal reception.

Satellite modem 235 can be implemented using the Iridium Short Burst Data (SBD) service. This is a low cost short message data service with worldwide coverage. Messages can be sent to either another SBD modem or to an Internet email address. The present invention will use this service for reference phase requests when terrestrial Internet coverage is not available. The service will also be used to allow utility crews to send short text messages to other utility crews or to utility dispatch.

Although tagging reference phase is the most confusing aspect of phase identification for most linemen its concept is quite simple. Tagging reference phase is simply the phase attribute chosen by the utility to designate each of the three feeders from a particular substation. The confusion is due to the difficulty of manually setting up the tagging reference phase configuration file on the field client (or base server) PC.

Figure 4:
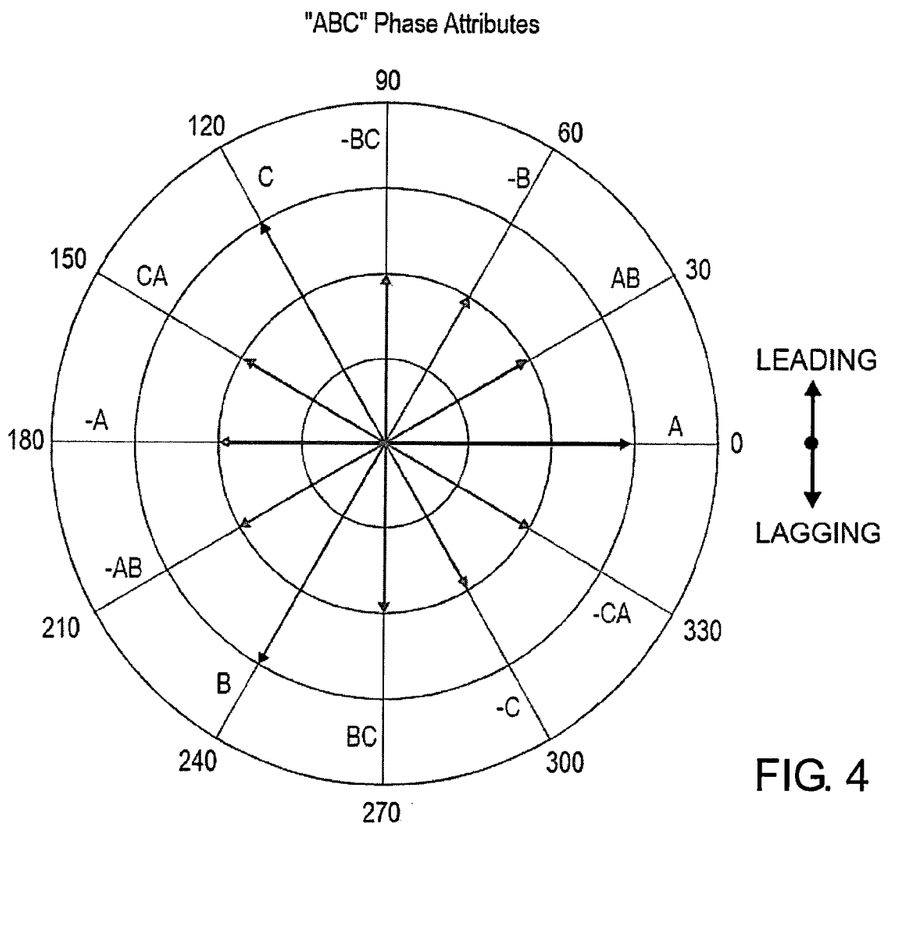
FIG. 4 is a vector diagram that illustrates all 12 phase attributes.
Figure 5:
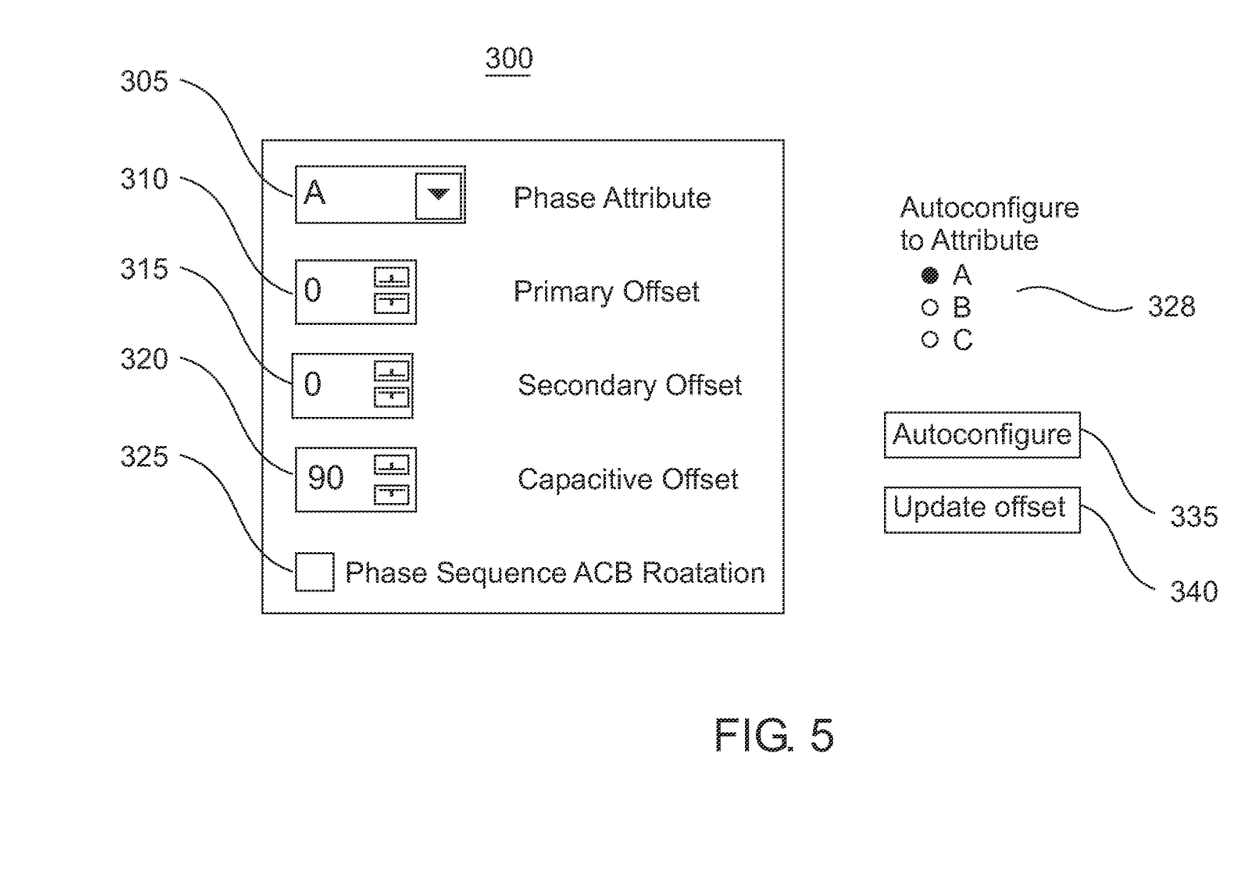
FIG. 5 illustrates an example of a field client configuration file setup screen.

The 12 phase attributes for counterclockwise ABC rotation in FIG. 1 are illustrated in FIG. 4. For clockwise ACB rotation, B attributes in FIG. 4 are changed to C attributes and C attributes in FIG. 4 are changed to B attributes. An example setup screen 300 implemented in field client 220 PC for setting up its tagging reference phase configuration file is illustrated in FIG. 5. Primary and Capacitive connections refer to direct and capacitive field probe 205 connections 200 respectively and indicate phase attributes A, B, or C. Secondary connections 200 refer to direct connections and indicate phase attributes A, -A, B, -B, C, -C, AB, -AB, BC, -BC, CA, and -CA. Phase offsets can be chosen for each of these three different types of connections 200. Rotation check box 325 is used to interchange attributes B and C for utilities that use clockwise ACB rotation.

To manually setup the configuration file for distribution substation 105 in FIG. 2, phase attribute 305 of setup screen 300 is initially set to A. Primary offset 310, secondary offset 315, and capacitive offset 320 are set to 0, 0, and 90 degrees respectively. Rotation check box 325 is not checked. A field probe 205 phase measurement is obtained, using primary connection 200, on tagging reference phase attribute A of feeder 112. That is, the utility chooses feeder 112 as being designated as phase attribute A.

Figure 6:
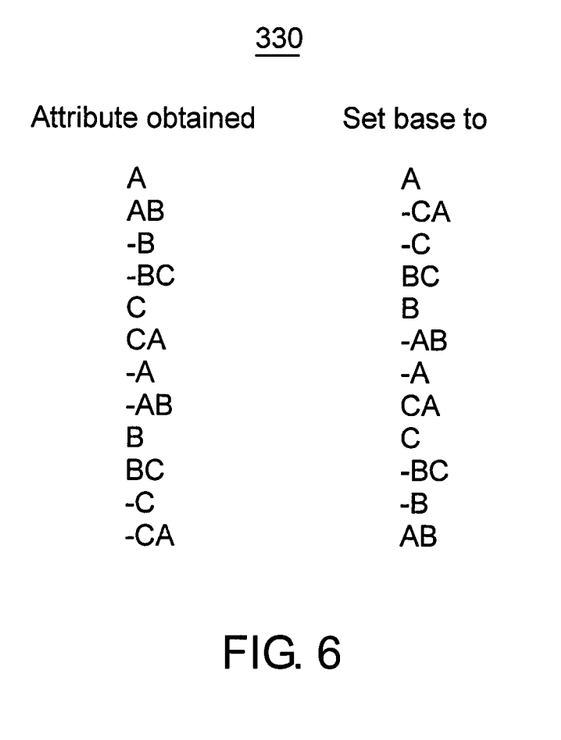
FIG. 6 illustrates an example of a field client setup table to create configuration files based on selected tagging reference phase.

If the reference location 100 were on phase A feeder 90 of DS transformer 75, then field client 220 would indicate phase attribute A for field probe 205 phase measurement on feeder 112 as indicated in setup table 330 illustrated in FIG. 6. However, since reference location 100 is on phase B feeder 85, field client 220 will indicate attribute C. Setup table 330 instructs the user to set phase attribute 305 to B. Then, field client 220 will correctly indicate phase attribute A for field probe 205 phase measurement, using a primary connection 200, on feeder 112. In effect, what setup table 330 does is allow the phase identification system to be used in reverse to setup the reference phase. The phase attribute of feeder 112 is known (because the utility designates or defines it as A) but the reference phase of feeder 85 relative to feeder 112 is not known. Setup table 330 defines what the reference phase must be called in order for the phase identification system to indicate feeder 112 as A.

Figure 10:
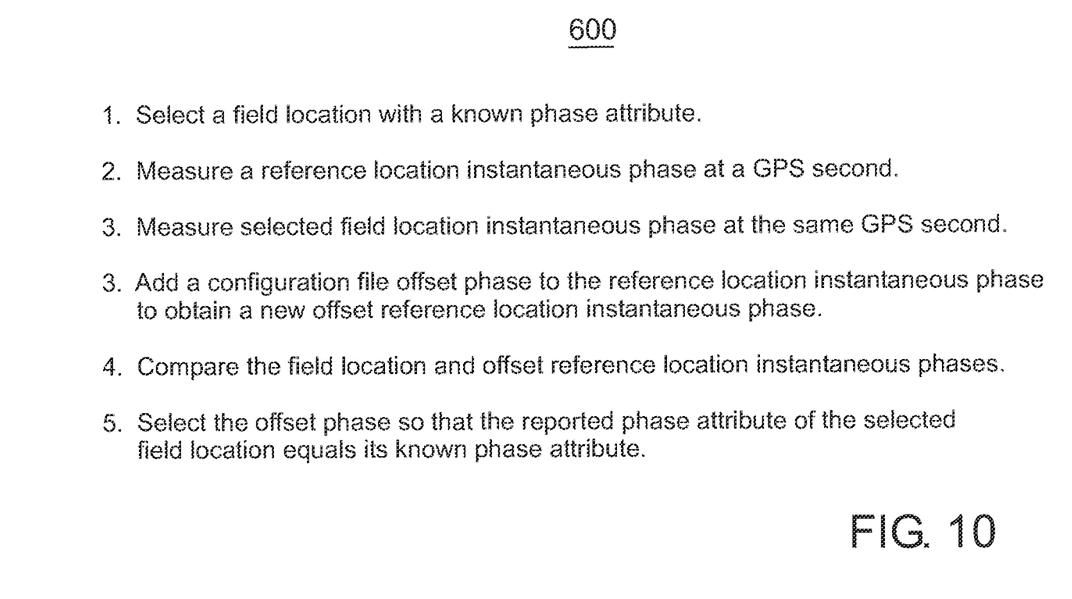
FIG. 10 illustrates the process steps to setup tagging reference phase configuration file offset phase.

Operationally, the software calculates an offset phase that is added to the GPS second instantaneous phase retrieved from the base server to obtain a new offset reference location instantaneous phase. The setup table indicates the value of this offset phase that must be added to the original base server phase so that the reported field phase attribute matches the known phase attribute of the conductor being measured. These process steps 600 are listed in FIG. 10.

Additionally, if field probe 205 obtained the phase measurement via direct connection (primary reading) and field client 220 indicated a phase error of 10 degrees, then primary offset 310 would have to be set to 10 to cancel out this 10 degree phase error.

If a delta-wye transformer was used in transmission substation 65 and an autotransformer was used in transmission substation 102, an additional plus or minus 30 degrees phase shift would be present between feeder 85 and feeder 112 because a 30 degree rotation does not occur in an autotransformer. In general, multiple 30 degree rotations plus arbitrary phase shifts can occur between the reference location 100 and field location 115. Phase rotations almost always exist between different classes of transmission and distribution voltages (345 KV vs. 115 KV vs. 69 KV etc).

Additionally, some large utilities became large by buying up many smaller utilities. Since feeder phase attribute designations of distribution substations are somewhat arbitrary, an identical voltage phases in two adjacent small utilities might have been designated using different phase attributes. The new large utility might not wish to retag all the phase attributes in one previous small utility to match those in the adjacent previous small utility. For example, identical field probe 205 phase measurements on the same conductor might be tagged B and C respectively in the two adjacent previously small utilities.

The keys to keeping track of all the different tagging reference phases in a utility are setup table 330, setup screen 300, field client 220 configuration file, and base server 245 configuration file. Until a user sets up a configuration file for a substation, phase attributes displayed on the field and base PCs are essentially worthless. However, once a configuration file is created and named appropriately using the substation name and voltage (for example Kirkland-69 KV), it can be used anywhere throughout that substation's service area. Except for the occasionally tweaking of setup screen 300 connection 200 offsets to compensate for new construction or seasonal load changes, these configurations files normally never have to be changed.

An average utility might end up with between 6 to 12 different configuration files depending on its size and its number of different voltage classes. When taking new measurements in an existing configuration file service area, the user simply clicks on File/Open and selects the name of the configuration file. This sets all setup windows in setup screen 300 to their stored values.

The present invention automates this important creation of tagging reference phase configuration files. To create a new configuration file, the user first obtains a field probe 205 phase measurement on the conductor he wishes to assign a phase attribute. He then opens setup screen 300 and clicks on the radio button 328 next to the phase attribute (A, B, or C) he wishes to assign to that conductor. Next, he clicks on the autoconfigure button 335. This commands field client 220 software to use one or more setup tables 330 (similar to the one illustrated in FIG. 6) to determine the phase attribute 305 and connection offset 310, 315, or 320 such that the selected phase attribute will be displayed with zero phase error for that phase measurement. The software then prompts the user to save the new configuration file to an existing or new filename. At a later time, by clicking on the update offset button 340, the software will automatically adjust the offset 310, 315, or 320 for the connection type currently selected so as to reset the attribute phase error to zero.

The present invention will also implement a setup screen to allow the user to pair short range radio 225 in field client 220 with short range radio 210 in field probe 205. The preferred short range radio implementation is to use BLUETOOTH brand wireless technology standard serial port modules which are readily available. These modules appear as a standard serial port device to the PC which removes most of the setup and pairing complexity. Their use allows a standard setup procedure to be used for any brand of PC used as field client 220.

Figure 7:
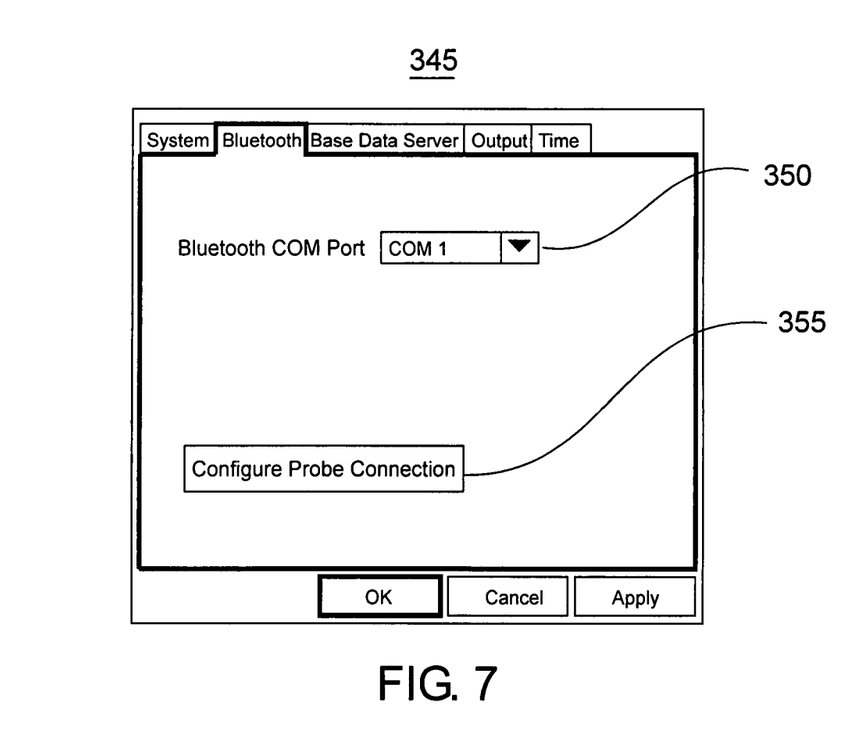
FIG. 7 illustrates an example of a field client BLUETOOTH brand wireless technology standard setup screen.

An example BLUETOOTH brand wireless technology standard setup screen 345 is illustrated in FIG. 7. The user selects the COM port 350 assigned by the PC for the USB or RS232 module. For the initial setup, the user clicks on the configure probe connection button 355 to pair the field probe 205 and field client 220 modules. A series of steps is presented to the user to walk the user through a simple pairing procedure. This procedure does not have to be repeated until a different field probe 205 or field client 220 are used together.

The present invention will allow the field client to select one of multiple base servers 245 to use. If one server is down, another can be chosen. A field client server selection setup screen will allow the IP address and Server port of each base server 245 to be setup and saved. Likewise, each base server 245 will include a server setup screen to allow the user to designate the Server port number and the password.

For some base server 245 implementations, multiple user passwords will be assigned and an activity log will be maintained to log usage by each user. This feature will allow a single multi-client base server 245 to support multiple different utilities. As many utilities already equip their trucks with laptop PCs, these utility owned PCs can be used as Field client 220. Thus, the multi-client server feature of the present invention allows a customer to purchase only field probe 205 to obtain the benefits of this phase identification system.

For each field probe 205 measurement taken, the field client will add a new record to a measurement file. Each record will contain a number of fields. As an example, the first field of the record can be a measurement record number that identifies when the measurement was taken. For example, the format wwww-tttttt combines the GPS week (wwww) and GPS time (tttttt). The remaining fields will consist of field probe 205 measured phases, requested reference phases from base server 245, and configuration file used.

Figure 8:
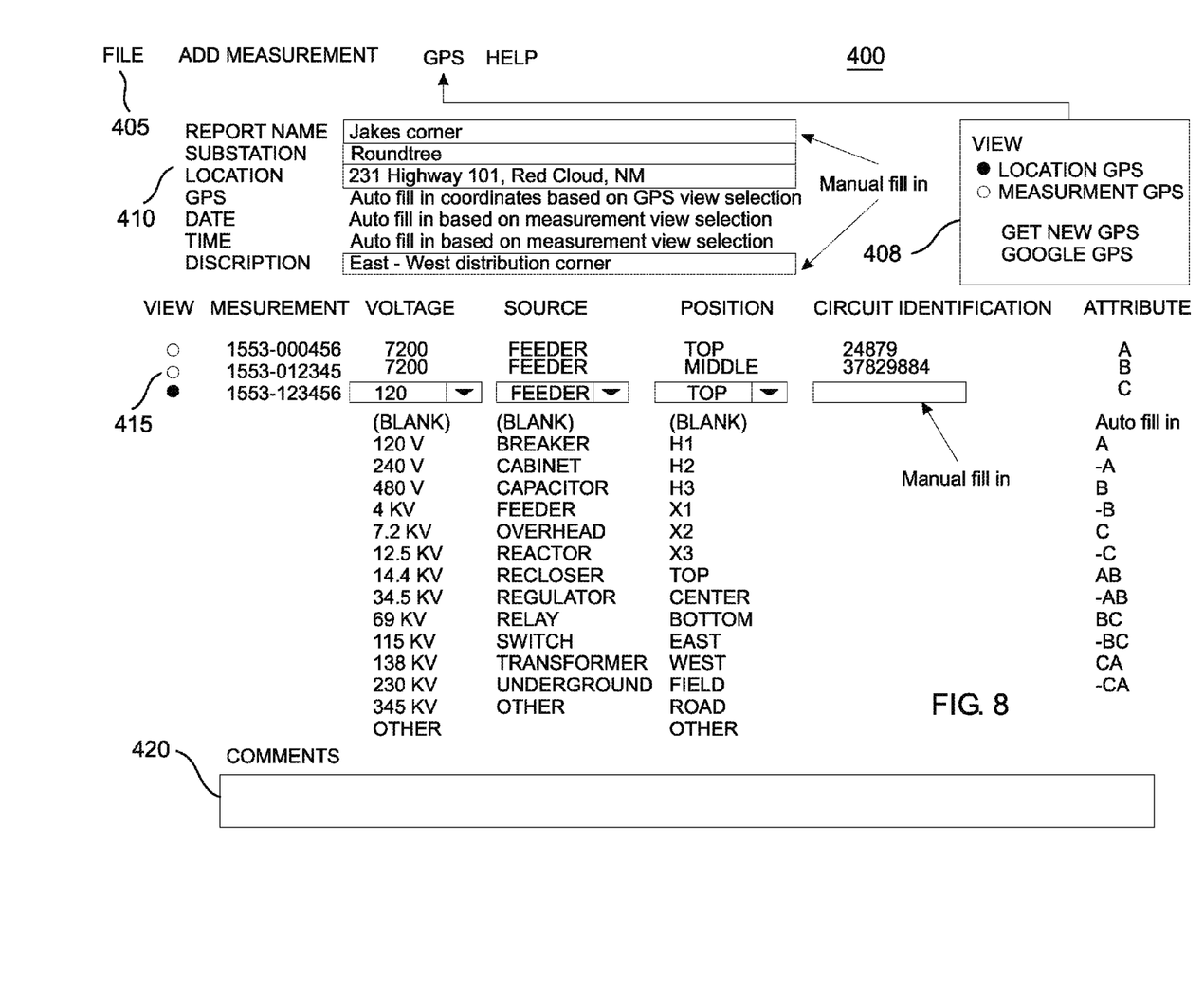
FIG. 8 illustrates an example of a field client report screen in which user inputs can be added to a measurement record or saved as a report file.

If base server 245 was not accessible due to being down or Internet service was not available, the requested reference phases will be added to the record later when service becomes available. A color coded dot can proceed each record to indicate if the record was decoded to phase attribute or not. For example, green dots can proceed decoded records and red dots for non-decoded records. This measurement file feature of the present invention allows field probe 205 measurements to be gathered and their sequences decoded later. Field client 220 will also include a report screen 400 such as illustrated in FIG. 8. This screen allows the lineman to add user information about the measurement to each record or to a separate report file.

In general, lineman will gather a measurement on all three phases at a particular location. Therefore, the example report screen in FIG. 8 allows the lineman to associate multiple measurements with a single report and save them in a separate report file. Either prior to or after taking field probe 205 phase measurements, the manual portion of section 410 will be filled in. This information includes the report name, substation region, measurement location, and a measurement description. The location GPS coordinates, date, and time will be automatically filled in.

Section 405 allows measurements from the measurement file to be added to the form via a dropdown ADD MEASUREMENT selection menu. The dropdown will list all available measurements. The GPS button opens the GPS view window 408. The GET NEW GPS button commands field probe 205 to take another GPS location reading. This allows the user to place field probe 205 in a central measurement location where many satellites are in view so as to record very precise GPS coordinates. Selecting the LOCATION GPS radio button displays this GPS location in the GPS field of section 410 whereas the MEASUREMENT GPS radio button displays the GPS coordinates of the currently selected measurement in section 415. The GOOGLE GPS button provides a link to GOOGLE MAP web mapping service application so the lineman can view the selected location.

The VIEW field radio buttons in section 415 places dropdown menus on the selected measurement so the lineman can select standard responses without typing. If typing is required, OTHER is selected. The attribute field is automatically filled in assuming an attribute was determined by the field client 220. The comments section 420 allows the lineman to add extensive notes if required. Once this report form is filled out, the lineman can save it to a current or new filename via the FILE selection in section 405.

Field probe 205 will operate both in manual mode, as described in referenced U.S. Pat. Nos. 6,667,610 and 7,031,859, and automatic mode as described in the present disclosure. This feature allows the customer to gather phase measurements even in totally shielded vaults and enclosures where short range radio and wireless Internet reception are not possible. The automatic mode will also be implemented in a fashion that allows a current customer to easily upgrade his manual mode field probe to automatic mode. Automatic mode will display phase attribute while still touching the conductor by flashing the current manual mode field probe's yellow, red, and green LEDs.

To speed up measurements on a series of overhead lines, multiple measurements will be automatically stored in field client 220. Each new measurement will be initiated upon detection of new power line voltage that occurs a few seconds after the previous power line voltage terminates. This feature allows the worker to measure the phase on a number of high overhead lines without having to retrieve field probe 205 after each measurement.

A handheld implementation of field probe 205 will be implemented for use on common distribution voltages such as 120/240 volts. This field probe will capacitive couple via close proximity to the energized conductor so it doesn't have to actually touch a live conductor. This allows the handheld field probe to be used by low-labor-cost non-lineman personnel. The primary use of this handheld field probe is to determine and log the phase attribute and GPS location of residential power meters simply by placing the field probe close to the meter. Residence phase attribute is normally required when installing Smart Meters or when building a Smart Grid. This feature of the present invention will greatly reduce the expense of obtaining these phase attributes.

Both the lineman and non-lineman versions of field probe 205 will contain provisions to use a ground cable. All voltage and phase measurements take place between the conductor and ground. When the field probe is not grounded, ground reference is obtained via capacitive coupling of field probe 205 instrument case to ground. If the instrument case is close to another energized conductor, field probe 205 will partially measure voltage and phase between the two conductors and ground instead of strictly between the conductor and ground. The result is an increase in measurement phase error. Allowing the field probe to be connected to a hard ground via a ground cable removes this phase error. This feature of the present invention allows field probe 205 to be used as a precision phase meter.

Although the preferred embodiments of the invention have been illustrated and described in detail, it will be readily apparent to those skilled in the art that various modifications may be made therein without departing from the spirit of the invention.

What is claimed is:

1. A method of identifying phase in a three-phase power distribution network, said method comprising:
    providing a field probe at a field location, said field probe configured to measure said field location instantaneous phase at a GPS second;
    providing a base server at a reference location, said base server configured to store said reference location instantaneous phase at each GPS second;
    providing a field client at said field location, said field client configured to communicate with said field probe and said base server;
    communicating said field location instantaneous phase to said field client; transmitting a reference phase request for said GPS second from said field client to said base server;
    transmitting said reference location instantaneous phase for said reference phase request from said base server to said field client; and
    comparing said field location and said reference location instantaneous phases in said field client to determine said field location phase attribute.

2. A method as claimed in claim 1 wherein said communicating is via short range radio.

3. A method as claimed in claim 1 wherein said field client can select one of multiple base servers and said base server can service multiple simultaneous field clients.

4. A method as claimed in claim 1 wherein said transmitting is via wireless Internet modem.

5. A method as claimed in claim 1 additionally comprising:
    measuring GPS coordinates of said field location using said field probe;
    communicating said GPS coordinates to said field client; and
    displaying and storing said GPS coordinates on said field client.

6. A method as claimed in claim 1 additionally comprising:
    implementing a measurement file on said field client;
    adding a new record to said measurement file for each said field probe measurement; and
    providing means to enter user data into said record.

7. A method as claimed in claim 1 wherein said field client implementation is either a personal computer, smartphone, or personal digital assistant.

8. A method as claimed in claim 1 wherein said field probe is implemented as a handheld field probe that capacitive couples to an energized conductor via close proximity to said energized conductor.

9. A method as claimed in claim 1 wherein said transmitting is via satellite modem.

10. A method as claimed in claim 9 wherein said satellite modem implements Iridium short burst data service.

11. A method as claimed in claim 9 additionally comprising means for sending and receiving text messages.

12. A method of identifying phase in a three-phase power distribution network, said method comprising:
    measuring a reference location instantaneous phase at a GPS second;
    measuring a field location instantaneous phase at said GPS second, said field location having a known field phase attribute;
    adding a configuration file phase offset to said reference location instantaneous phase to obtain an offset reference location instantaneous phase;
    comparing said field location instantaneous phase and said offset reference location instantaneous phases to obtain a reported field phase attribute; and
    selecting said phase offset so that said reported field phase attribute equals said known field phase attribute.

13. A method as claimed in claim 12 wherein said selecting is implemented manually using a phase offset lookup table.

14. A method as claimed in claim 12 additionally comprising means for naming, storing, and retrieving said configuration file.

15. A method as claimed in claim 12 additionally comprising:
    providing a setup screen to select said known field phase attribute;
    providing an autoconfigure button to commence said selecting; and
    automatically calculating said phase offset when said autoconfigure button is clicked.

16. An apparatus for identifying phase in a three-phase power distribution network, said apparatus comprises:
    a field probe configured to measure an instantaneous conductor phase at a field GPS second;
    a base server configured to store an instantaneous reference phase at each GPS second;
    a field client configured to receive said conductor phase and said field GPS second from said field probe, transmit said field GPS second to said base server, and receive said reference phase at said field GPS second from said base server; and field client software for comparing said conductor phase with said reference phase to determine said conductor phase attribute.

17. An apparatus as in claim 16 wherein said field client comprises:
a short range radio configured to communicate with said field probe; and
a wireless Internet modem configured to communicate with said base server via the Internet.

18. An apparatus as in claim 16 wherein said field client comprises:
a short range radio configured to communicate with said field probe; and
a satellite modem configured to communicate with said base server using Iridium short burst data service.

19. An apparatus as in claim 16 wherein said field client is implemented using either a personal computer, smartphone, or personal digital assistant.

20. An apparatus as in claim 16 wherein said field client software is configured to automatically create tagging reference phase configuration files that can be named, saved, and loaded.

* * * * *